(12) United States Patent
Avantaggiati et al.

(10) Patent No.: US 10,805,183 B2
(45) Date of Patent: Oct. 13, 2020

(54) METHOD AND APPARATUS FOR SAMPLING RATE CONVERSION OF A STREAM OF SAMPLES

(71) Applicant: OCTO TELEMATICS S.p.A., Rome (IT)

(72) Inventors: Vito Avantaggiati, Rome (IT); Marco Amendolagine, Rome (IT)

(73) Assignee: OCTO TELEMATICS S.p.A., Rome (IT)

( * ) Notice: Subject to any disclaimer, the term of this patent is extended or adjusted under 35 U.S.C. 154(b) by 103 days.

(21) Appl. No.: 16/306,133

(22) PCT Filed: May 31, 2017

(86) PCT No.: PCT/EP2017/063197
§ 371 (c)(1),
(2) Date: Nov. 30, 2018

(87) PCT Pub. No.: WO2017/207655
PCT Pub. Date: Dec. 7, 2017

(65) Prior Publication Data
US 2020/0186448 A1 Jun. 11, 2020

(30) Foreign Application Priority Data

May 31, 2016 (GB) .................................. 1609509.3
Jul. 8, 2016 (IT) ........................ 102016000071534

(51) Int. Cl.
*H04L 12/26* (2006.01)

(52) U.S. Cl.
CPC .......... *H04L 43/024* (2013.01); *H04L 43/026* (2013.01)

(58) Field of Classification Search
CPC .. H03H 17/28; H03H 17/0642; H03H 7/0102; H03H 7/0135; H03H 17/0294; H03H 17/0685
See application file for complete search history.

(56) References Cited

U.S. PATENT DOCUMENTS 6,208,671 B1 * 3/2001 Paulos ............... H03H 17/0628
341/61
6,691,082 B1 * 2/2004 Aguilar ............... G10L 19/0208
704/219

(Continued)

OTHER PUBLICATIONS

Ang et al. "Virtex FPGA Implementation of a Polyphase Filter for Sample Rate Conversion" Signlas, Systems and Computers, 2000 pp. 365-369, vol. 1.

*Primary Examiner* — Mewale A Ambaye
(74) *Attorney, Agent, or Firm* — Arent Fox LLP; Michael Fainberg

(57) ABSTRACT

Disclosed herein is a method and apparatus for converting a stream of samples at a first sampling rate to a stream of samples at a second sampling rate. An exemplary method includes measuring the first sampling rate; determining a first upsampling factor from a basis including: the measured first sampling rate, the target value of the second sampling rate, and a resynchronisation error factor, the first upsampling factor being constrained to be an integer power of a predetermined integer value; and deriving, from a reference set of filter coefficients and from a ratio of the first upsampling factor to a reference upsampling factor, a first set of filter coefficients for use in a first interpolation filter, the reference set of filter coefficients being for a reference upsampling factor that is an integer power of the predetermined integer value.

11 Claims, 11 Drawing Sheets

(56) References Cited

U.S. PATENT DOCUMENTS

| | | | | |
|---|---|---|---|---|
| 7,283,076 | B1* | 10/2007 | Ding | H03H 17/0614 |
| | | | | 341/143 |
| 2002/0140853 | A1* | 10/2002 | Yang | H03H 17/028 |
| | | | | 348/441 |
| 2004/0240588 | A1* | 12/2004 | Miller | H04L 25/14 |
| | | | | 375/340 |
| 2005/0157828 | A1* | 7/2005 | Midya | H03H 17/028 |
| | | | | 375/372 |
| 2005/0168360 | A1* | 8/2005 | Chen | H03H 17/028 |
| | | | | 341/61 |
| 2007/0192390 | A1* | 8/2007 | Wang | H03H 17/0685 |
| | | | | 708/270 |
| 2009/0144064 | A1* | 6/2009 | Sakurai | G10L 21/04 |
| | | | | 704/503 |
| 2010/0091922 | A1* | 4/2010 | Magrath | H03H 17/0628 |
| | | | | 375/355 |
| 2010/0134336 | A1* | 6/2010 | Sung | H03H 17/0685 |
| | | | | 341/144 |
| 2015/0098526 | A1* | 4/2015 | Hind | H03H 17/0621 |
| | | | | 375/316 |

* cited by examiner

METHOD AND APPARATUS FOR SAMPLING RATE CONVERSION OF A STREAM OF SAMPLES

CROSS-REFERENCE TO RELATED APPLICATIONS

This application is the U.S. National Stage Application of International Patent Application No. PCT/EP2017/063197, filed on May 31, 2017, which claims priority to Italian Patent Application No. 102016000071534, filed on Jul. 8, 2016 and United Kingdom Patent Application No. 1609509.3, filed on May 31, 2016 the contents of each of which is incorporated herein by reference in its entirety.

TECHNICAL FIELD

The present invention relates generally to methods and apparatus for conversion of a stream of samples at a first sampling rate to a stream of samples at a second sampling rate, and, more specifically, but not exclusively, to adaptive conversion from a first sampling rate which is subject to deviation from a nominal value to a second sampling rate which is within a predetermined resynchronisation error factor from a target value.

BACKGROUND

In digital systems involving processing of sampled data, it may be necessary to convert the sampled data from one sampling rate to another. For example, a sensor system, such as an accelerometer in a vehicle, may sample data at a first rate, and this may be connected to a digital processing system which processes data samples at a different rate. The clock signals for the sensor and the digital processor may be generated by different oscillators operating independently of each other, so that the precise relationship between the first and second rates is not known, and may be subject to variability, for example with temperature and variability between units. In particular, a sensor may have an internal oscillator having a low accuracy, which may be subject to deviation from a nominal value by +/−10% or more, for example due to the use of RC or LC oscillators, and a digital processing system may have a very accurate clock derived from a crystal oscillator. In order to process the sampled data effectively, it may be desired to produce resynchronised sampled data to within a predetermined resynchronisation error factor from a target value.

It is known to convert sampled data from a first sampling rate to a second sampling rate by upsampling to a higher sampling rate that is a multiple of both the first and second sampling rates, filtering the upsampled data using an interpolation filter, and then downsampling to the second sampling rate. However, in order to implement such a system when the ratio between the sampling rates is subject to variability over a wide range, a wide range of upsampling and downsampling factors may need to be accommodated, and this may lead to high system complexity. In particular, each combination of upsampling and downsampling factors may require different filter coefficients for the interpolation filter, and this may be demanding of memory resource in addition to adding to the complexity of the system.

SUMMARY

In accordance with a first aspect of the present invention, there is provided a method of converting a stream of samples at a first sampling rate to a stream of samples at a second sampling rate, the first sampling rate being subject to deviation from a nominal value and the second sampling rate being within a predetermined resynchronisation error factor from a target value, the method comprising:
measuring the first sampling rate;
determining a first upsampling factor from a basis comprising: the measured first sampling rate, the target value of the second sampling rate, and a resynchronisation error factor, the first upsampling factor being constrained to be an integer power of a predetermined integer value; and
deriving, from a reference set of filter coefficients and from a ratio of the first upsampling factor to a reference upsampling factor, a first set of filter coefficients for use in a first interpolation filter, the reference set of filter coefficients being for a reference upsampling factor that is an integer power of the predetermined integer value.

This allows an implementation having reduced complexity and having a reduced requirement for memory resource for storage of filter coefficients. In particular, constraining the first upsampling factor to be an integer power of a predetermined integer value, typically a power of 2, limits the range of possible upsampling factors, and may accordingly reduce system complexity, and deriving the filter coefficients for use in the first interpolation filter from a reference set of filter coefficients that are for a reference upsampling factor that is also an integer power of the predetermined integer value, may reduce the requirement for memory resource for storage of filter coefficients.

In an embodiment of the invention, deriving the first set of filter coefficients from the reference set of filter coefficients comprises:
in dependence on the first upsampling factor being greater than the reference upsampling factor, linear interpolation between the reference set of filter coefficients;
in dependence on the first upsampling factor being equal to the reference upsampling factor, setting them to be the same as the reference set of filter coefficients; and
in dependence on the first upsampling factor being less than the reference upsampling factor, uniform decimation from the reference set of filter coefficients, a decimation factor of the uniform decimation being equal to the integer ratio of the reference upsampling factor to the first upsampling factor.

This provides a computationally efficient method of deriving a set of filter coefficients for an interpolator filter, due to the simplicity of the linear interpolation and the uniform downsampling, while reducing memory resource requirements, due to the fact that only a single set of coefficients, the set of reference filter coefficients, is stored in memory.

In an embodiment of the invention, the predefined integer value is 2.

This provides a very efficient implementation.

In an embodiment of the invention, the first interpolation filter and the reference interpolation filter are polyphase filters. The first interpolation filter has a number of phases equal to the first upsampling factor and the reference interpolation has a number of phases equal to the reference upsampling factor.

This provides an efficient implementation.

In an embodiment of the invention, the method comprises:
determining a first downsampling factor from a basis comprising: the measured first sampling rate, the target value of the second sampling rate, and the predetermined resynchronisation error factor, the first downsampling factor being an integer; and converting the stream of samples at the first sampling rate to the stream of samples at the second sampling rate by a processes comprising upsampling by the first upsampling factor, filtering using the first set of filter coefficients for the first interpolation filter and downsampling by the first downsampling factor.

Determining the first downsampling rate on a basis including the upsampling rate allows upsampling and downsampling rates to be selected that provide a sample rate conversion to within the predetermined resynchronisation error factor of the target value of the second sampling rate.

In an embodiment of the invention, determining the first upsampling factor and the first downsampling factor comprises:

determining a ratio of the target value of the second sampling rate to the measured first sampling rate; and selecting the value of the first upsampling factor and the first downsampling factor such that the error factor between the ratio of the target value of the second sampling rate to the first sampling rate and the ratio of the first upsampling factor to the first downsampling factor is less than the predetermined resynchronisation error factor.

In an embodiment of the invention the method comprises:
selecting a trial value of the first upsampling factor;
determining a trial value of the first downsampling factor on the basis of the determined ratio of the target value of the second sampling rate to the measured first sampling rate and on the selected trial value of the first upsampling factor;

calculating a resynchronisation error factor on the basis of the trial values of the first upsampling factor and the first downsampling factor;

in dependence on the resynchronisation error factor being greater than a threshold value, iteratively incrementing the trial value of the first upsampling factor and the trial value of the first downsampling factor and calculating a resynchronisation error factor; and selecting a respective value of the incremented first upsampling factor and the first downsampling factor which gives a resynchronisation error factor less than or equal to the threshold value.

This provides an efficient method of iteratively determining the upsampling and downsampling factors.

In an embodiment of the invention the deviation from the nominal value of the first sampling rate may be greater than +/−1%, and may be greater than +/−10%.

In accordance with a second aspect of the invention, there is provided apparatus for converting a stream of samples at a first sampling rate to a stream of samples at a second sampling rate, the first sampling rate being subject to deviation from a nominal value and the second sampling rate being within a predetermined resynchronisation error factor from a target value, the apparatus being configured to perform the claimed method.

In accordance with a third aspect of the invention, there is provided a sensing system for a vehicle, comprising:

a MEMS sensor configured to generate a stream of samples at a first sampling rate;

a data processing system configured to accept a stream of samples at a second sampling rate; and the claimed apparatus for converting a stream of samples at a first sampling rate to a stream of samples at a second sampling rate.

Further features and advantages of the invention will be apparent from the following description of exemplary embodiments of the invention, which are given by way of example only.

DETAILED DESCRIPTION

By way of example, embodiments of the invention will now be described in the context of an acceleration sensing system for a vehicle, comprising a MEMS (micro-electro-mechanical system) configured to generate a stream of samples at a first sampling rate and a data processing system configured to accept a stream of samples at a second sampling rate. It will be understood that embodiments of the invention may relate to other applications, and that embodiments of the invention are not restricted to use in vehicles or MEMS sensing systems. Embodiments may relate to other data processing systems involving sampling rate conversion.

Figure 1:
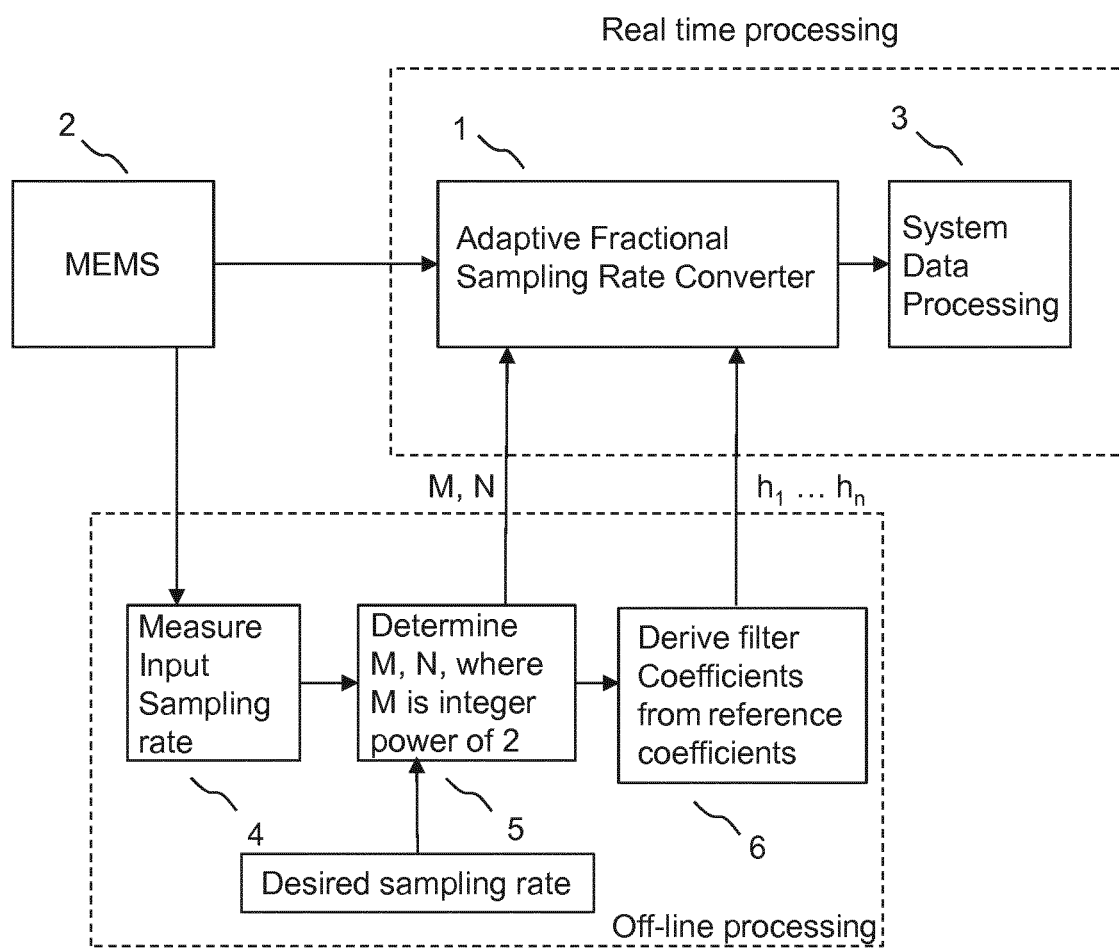
FIG. 1 is a schematic diagram illustrating a sampling rate conversion system in an embodiment of the invention.
Figure 2:
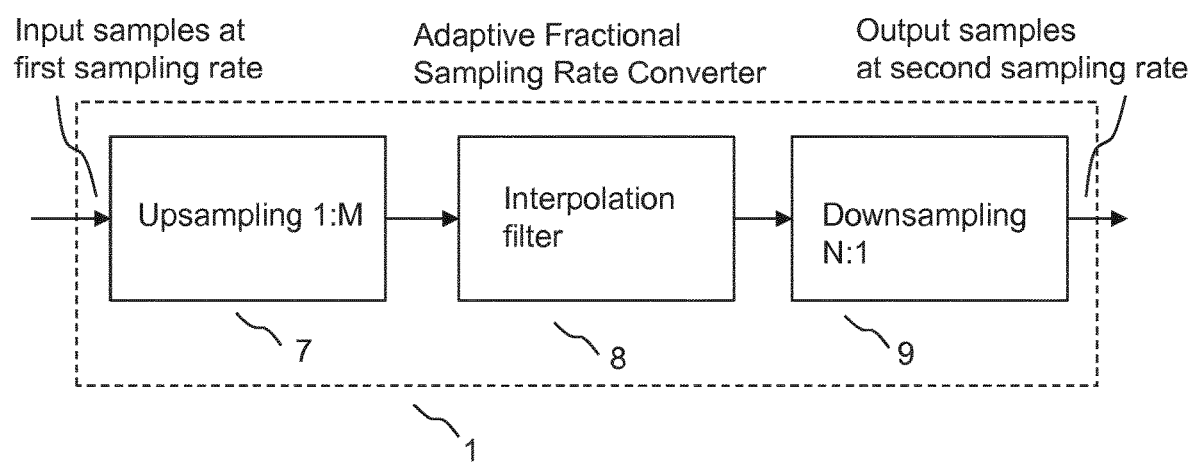
FIG. 2 is a functional schematic diagram illustrating an adaptive fractional sampling rate converter in an embodiment of the invention.

FIG. 1 shows a sampling rate conversion system in an embodiment of the invention. A MEMS acceleration sensor 2 is connected through an adaptive fractional sampling rate converter function 1 to a system data processing function 3. The adaptive fractional sampling rate converter function 1 is shown in more detail in FIG. 2. A stream of samples at a first sampling rate is upsampled 7 by an upsampling factor M, the upsampled stream of samples is passed through an interpolation filter 8, which may be a polyphaser filter, and downsampled 9 by a downsampling factor N to a second sampling rate. In this way, a stream of samples at a first sampling rate is converted to a stream of samples at a second sampling rate.

The first sampling rate is subject to deviation from a nominal value, which may be greater than +/−1%, and may be greater than +/−10% of the nominal value. The second sampling rate is arranged to be within a predetermined resynchronisation error factor from a target value.

As an example, the first sampling rate may be 1344 Hz+/−10%, and the target nominal value of the second sampling rate may be 200 Hz. The predetermined resynchronisation error factor with respect to the nominal value may be, for example, a factor between 10 and 100 parts per million (PPM), that is to say $10^{-5}$ to $10^{-4}$. The error factor is not limited to these values, but it is normally specified to be lower than the frequency deviation from the first sampling rate.

As shown in FIG. 1, the adaptive fractional sampling rate converter 1 and the system data processing 3 may operate with real time processing, that is to say the processing is performed on a the stream of data received from the MEMS at a sufficient rate that a continuous stream at the first data rate could be processed.

As also shown in FIG. 1, parameters for the control of the adaptive fractional sampling rate converter 1 may be calculated in off-line processing, that is to say non-real time, potentially involving processing at a slower rate than the real time processing. For example, the real time processing may be implemented in firmware, such as for example a programmable gate array, and the off-line processing may be implemented in software, for example software executed by a control processor, such as a microcontroller. A digital signal processing device may be programmed to perform the real time functions. The control processor and logic and/or digital signal processors may be integrated into an Application Specific Integrated Circuit (ASIC). Alternatively, embodiments of the invention may be implemented by a variety of other techniques, including software in the form of executable code stored in memory configured to cause one or more processors to perform the methods of embodiments of the invention.

As shown in FIG. 1, parameters for the control of the adaptive fractional sampling rate converter include the upsampling factor M, the downsampling factor N, and filter coefficients for the interpolation filter $h_1$-$h_n$. As shown in FIG. 1, the first sampling rate is measured 4. This may be performed, for example, by counting samples received from the MEMS sensor within a known time interval. The known time interval may be calculated on the basis of the clock of the data processing system, for example, which may have an accurate crystal controlled oscillator. An upsampling factor, M, is determined 5 from a basis comprising the measured first sampling rate, the target value of the second sampling rate, and a resynchronisation error factor.

In an embodiment of the invention, the upsampling factor is constrained to be an integer power of a predetermined integer value. In the example shown in FIG. 1, the predetermined integer value is 2, so that the upsampling factor is constrained to be a power of 2. As will be explained, this greatly reduces the complexity of the implementation, by reducing the range of possible upsampling factors, and so reducing the range of variations of interpolation filter that would be required. The range of variations of filter coefficients that need to be held in memory is accordingly reduced, which reduces demand on system memory resource.

As also shown in FIG. 1, a first set of filter coefficients $h_1$-$h_n$ is derived for use in the interpolation filter from a reference set of filter coefficients. The reference set of filter coefficients is for a reference upsampling factor that is also an integer power of the predetermined integer value, in this example a power of 2. The method used for the derivation of the first set of filter coefficients from the reference set of filter coefficients depends on the ratio of the upsampling factor to the reference upsampling factor.

Figure 3:
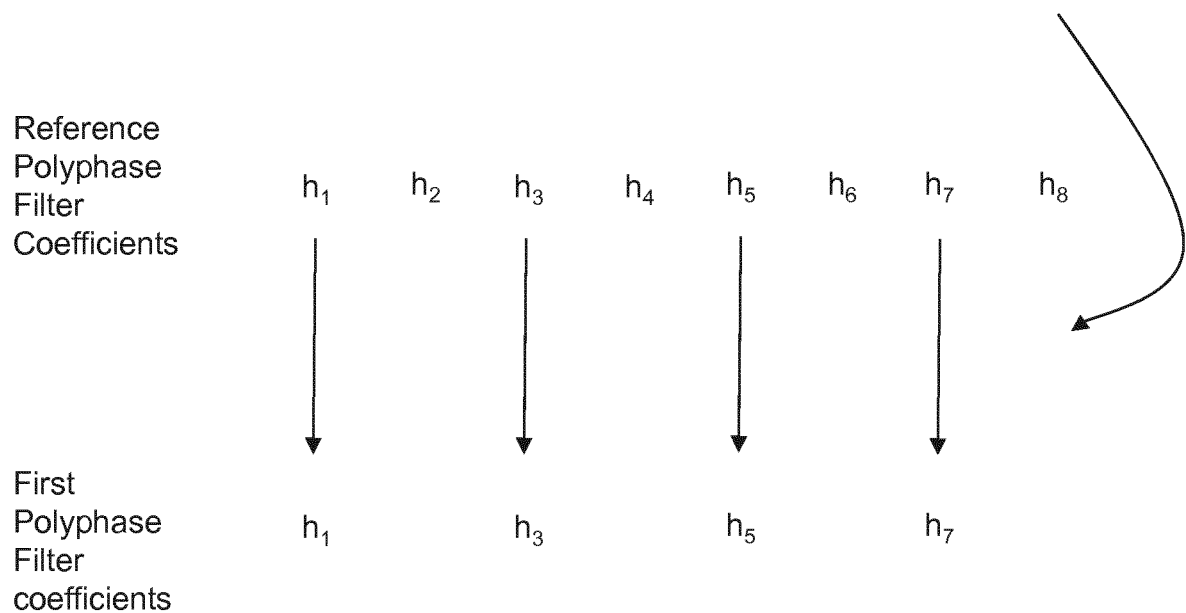
FIG. 3 is a schematic diagram illustrating derivation of polyphase filter coefficients by decimation for the case where the upsampling factor is less than the reference upsampling factor in an embodiment of the invention.
Figure 4:
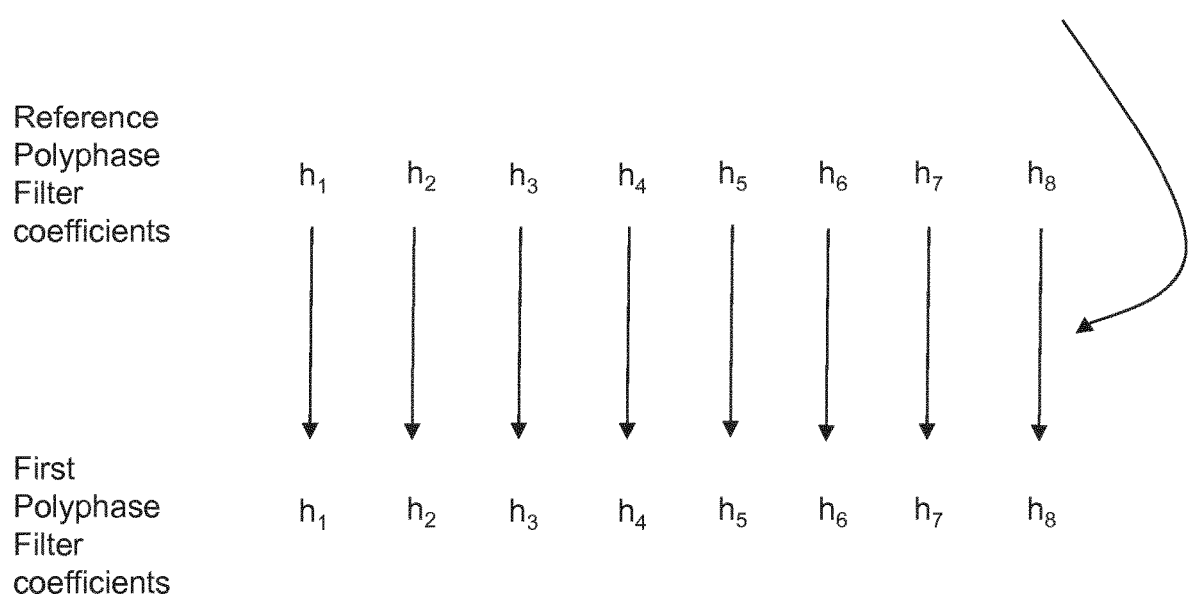
FIG. 4 is a schematic diagram illustrating derivation of polyphaser filter coefficients for the case where the upsampling factor is the same as the reference upsampling factor in an embodiment of the invention (in this example: $M_{ref}/M=2$)
Figure 5:
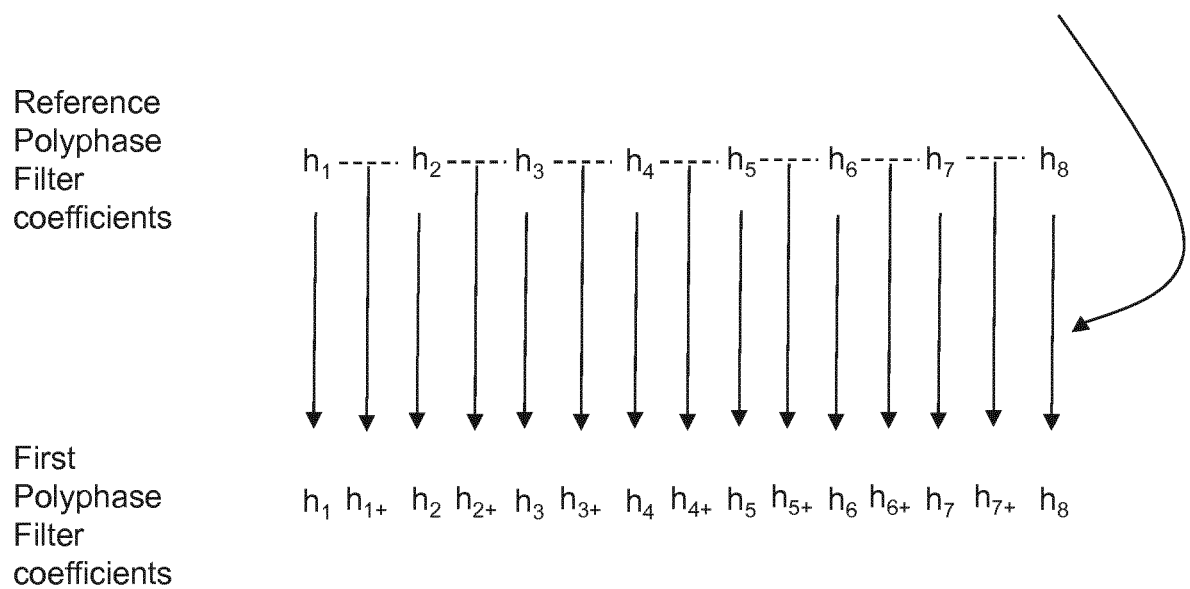
FIG. 5 is a schematic diagram illustrating derivation of polyphase filter coefficients by interpolation for the case where the upsampling factor is greater than the reference upsampling factor in an embodiment of the invention (in this example: $M/M_{ref}=2$)
Figure 6:
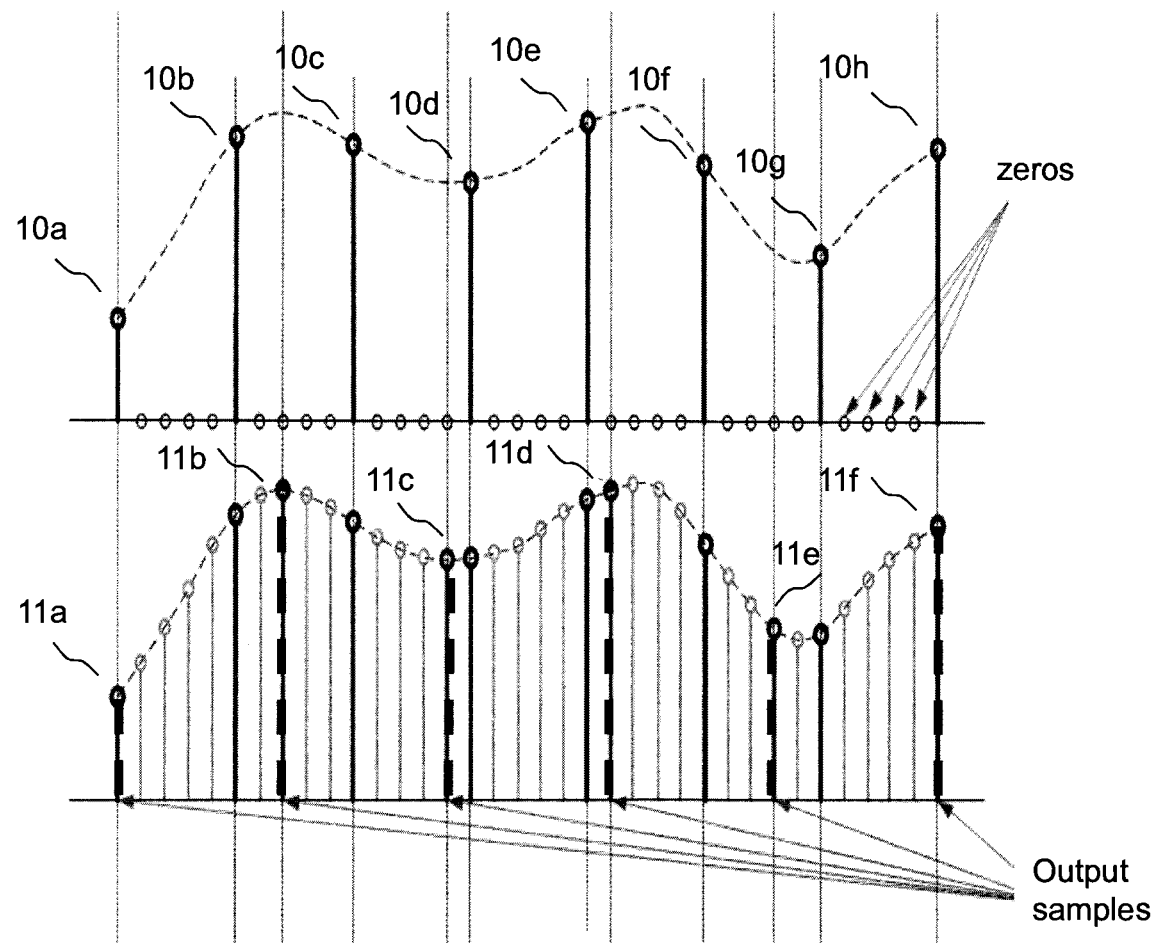
FIG. 6 is a schematic diagram illustrating interpolation in an embodiment of the invention.

FIGS. 3, 4 and 5 illustrate the derivation of the first set of filter coefficients from the reference set of filter coefficients for various cases of the ratio of the upsampling factor to the reference upsampling factor, for the example of the case of the predetermined integer factor being 2. FIG. 3 illustrates that, if the upsampling factor is greater than the reference upsampling factor, the first set of filter coefficients is determined by linear interpolation between the reference filter coefficients, that is to say the reference set of filter coefficients. FIG. 4 illustrates that if the upsampling factor is equal to the reference upsampling factor, the first set of filter coefficients is determined to be the same as the reference filter coefficients. FIG. 6 illustrates that if the upsampling factor is less than the reference upsampling factor, the first set of filter coefficients is determined by uniform decimation from the reference filter coefficients, the decimation factor being equal to the integer ratio of the reference upsampling factor to the upsampling factor. This provides a computationally efficient method of deriving a set of filter coefficients for an interpolator filter while reducing memory resource requirements for storing the filter coefficients.

FIG. 6 illustrates the operation of the interpolation filter. It can be seen that, in this example, the input samples 10a to 10h are a first sampling rate that is slower that the sampling rate of the output samples 11a to 11f. It can be seem that the input sampling rate is upsampled to a higher intermediate rate by the addition of zero-valued samples between the input samples. The effect of the interpolation filter is to fill in smoothly varying values between the input samples as shown. The output samples 11a to 11f can then be selected, to include interpolated values as appropriate, at the second sampling rate. The interpolation filter is typically a finite impulse response (FIR) filter and may be a polyphase filter.

Figure 7:
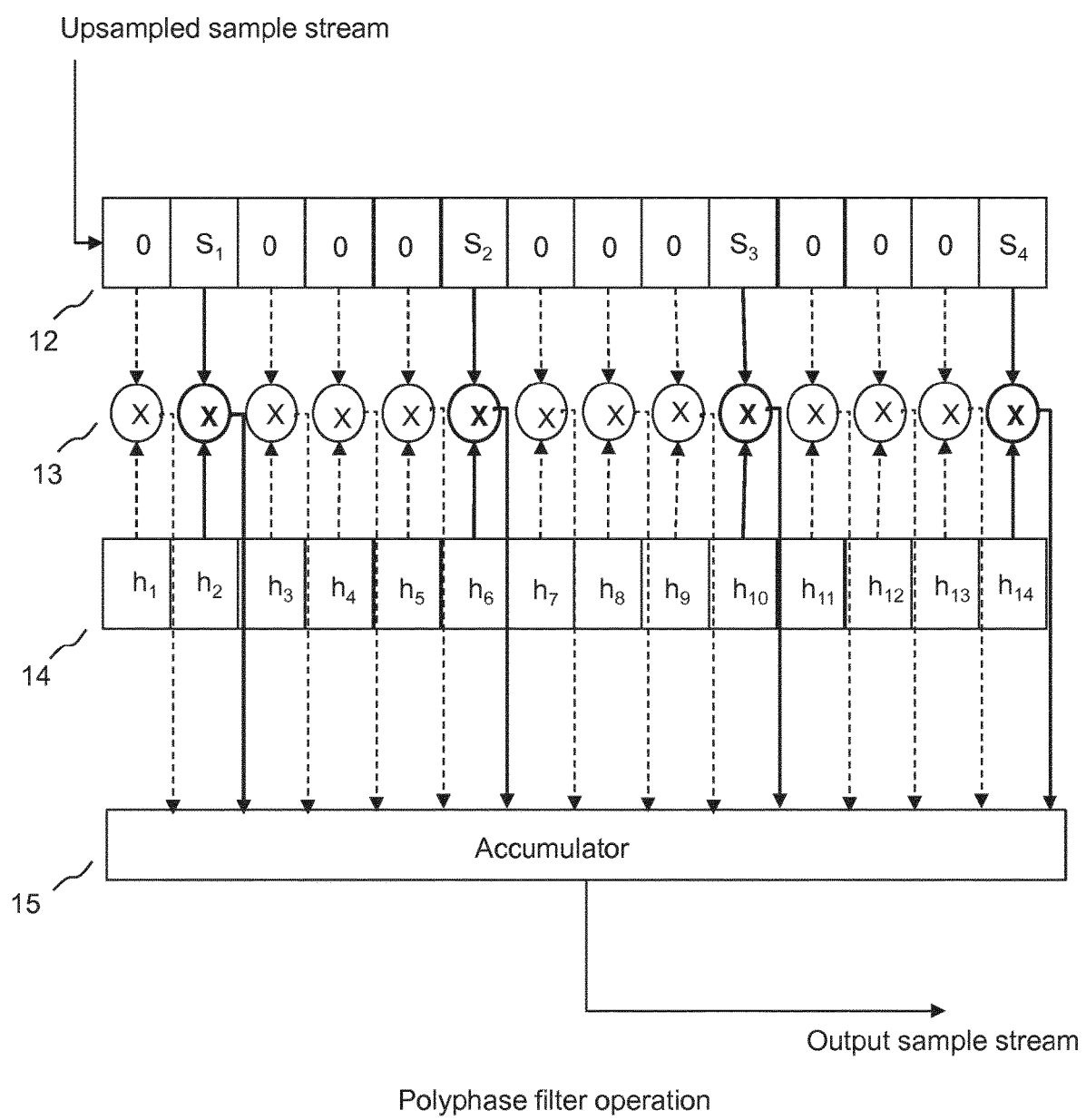
FIG. 7 is a schematic diagram illustrating polyphaser filter operation in an embodiment of the invention.

FIG. 7 illustrates the operation of a polyphase filter. An upsampled data stream 12 is shown that comprises input samples $S_1$-$S_4$, between which zero-valued samples have been added. Each sample from the upsampled data stream is multiplied 13 by a respective filter coefficient 14 $h_1$-$h_{14}$. The results of each multiplication are accumulated 15 and form the output sample stream. The output sample stream may then be downsampled to form a stream at the second sample rate. FIG. 7 shows a snapshot in time. On the next clock cycle at the upsampled sample rate, the input sample stream will move one place to the right. At any one time, not all multipliers are active, since many of the multipliers have a zero input. This is equivalent to keeping only the non-zero samples, i.e.: reducing the required samples register by a factor M, and changing the coefficients h accordingly to the sample to output. Furthermore, the calculation of output samples only needs to be performed for the subset of samples that will be selected when downsampled. The polyphase filter thus provides an efficient implementation in terms of use of signal processing resource.

In an embodiment of the invention, the first interpolation filter and the reference interpolation filter are polyphase filters. The first interpolation filter typically has a number of phases equal to the upsampling factor and the reference interpolation typically has a number of phases equal to the reference upsampling factor. The number of phases is one greater than the number of zeros added for each input sample. In the example of FIG. 7, the polyphase filter has 4 phases.

In an embodiment of the invention, the downsampling factor may be determined from the measured first sampling rate, the target value of the second sampling rate, and the predetermined resynchronisation error factor. The downsampling factor has an integer value. The stream of samples at the first sampling rate may be converted to the stream of samples at the second sampling rate by a processes comprising upsampling by the upsampling factor, filtering using the first set of filter coefficients for the first interpolation filter and downsampling by the downsampling factor.

The upsampling factor and the downsampling factor may be determined by determining the ratio of the target value of the second sampling rate to the measured first sampling rate, and selecting the value of the upsampling factor and the downsampling factor such that the error factor between the ratio of the target value of the second sampling rate to the first sampling rate and the ratio of the upsampling factor to the downsampling factor is less than the predetermined resynchronisation error factor. This may be implemented, for example, by an interative process as follows. A trial value of the upsampling factor may be selected, and a corresponding trial value of the downsampling factor may be determined from the ratio of the target value of the second sampling rate to the measured first sampling rate and the selected trial value of the upsampling factor. A resynchronisation error factor may be calculated on the basis of the trial values of the upsampling factor and the downsampling factor, and if the resynchronisation error factor is greater than a threshold value, the trial value of the upsampling factor may be incremented, and the trial value of the downsampling factor recalculated accordingly, and the resynchronisation error factor may then be recalculated. This incrementing of the upsampling factor may be repeated iteratively until values of the incremented upsampling factor and the downsampling factor are selected which give a resynchronisation error factor less than or equal to the threshold value. Since the upsampling factors are typically expressed in the form $2^Q$, the incrementing is typically done by incrementing only Q, because calculating $2^Q$ is a very simple hardware or software operation. This provides an efficient method of iteratively determining the upsampling and downsampling factors.

The reference upsampling factor may be determined, typically at the design stage, taking into account the expected range of values of the first sampling rate and the desired resynchronisation error factor with respect to the second sampling rate, given that the reference upsampling factor is constrained to be an integer power of the predefined integer, which is typically 2. A specific set of reference filter coefficients for operation for the reference upsampling factor may then be designed, and imported to the sampling rate converter system for storage in memory.

Figure 8:
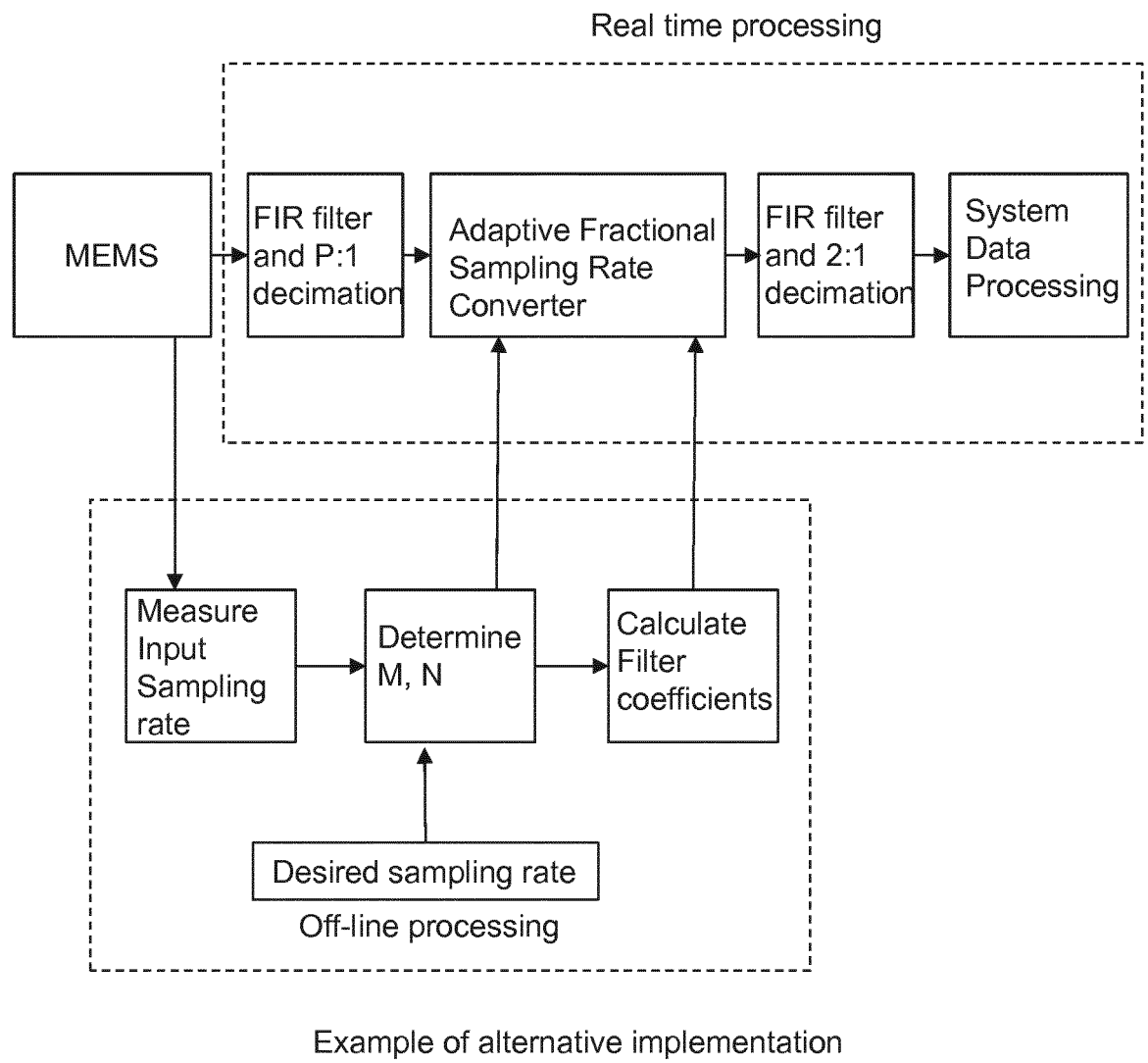
FIG. 8 is a schematic diagram illustrating a sampling rate conversion system in an alternative embodiment of the invention, which may provide a flexible output sampling rate which may be scaled by a configurable factor P.

FIG. 8 shows an alternative implementation, in which the adaptive fractional sampling rate converter is preceded by an FIR filter and decimation, in this case decimation by a configurable factor P, which may be for example 4:1 decimation, and followed by a further FIR filter and decimation, in this case decimation which may be by a further configurable factor, in this example 2:1 decimation. This may reduce the processing resource requirement in the adaptive fractional sampling rate converter.

Figure 9:
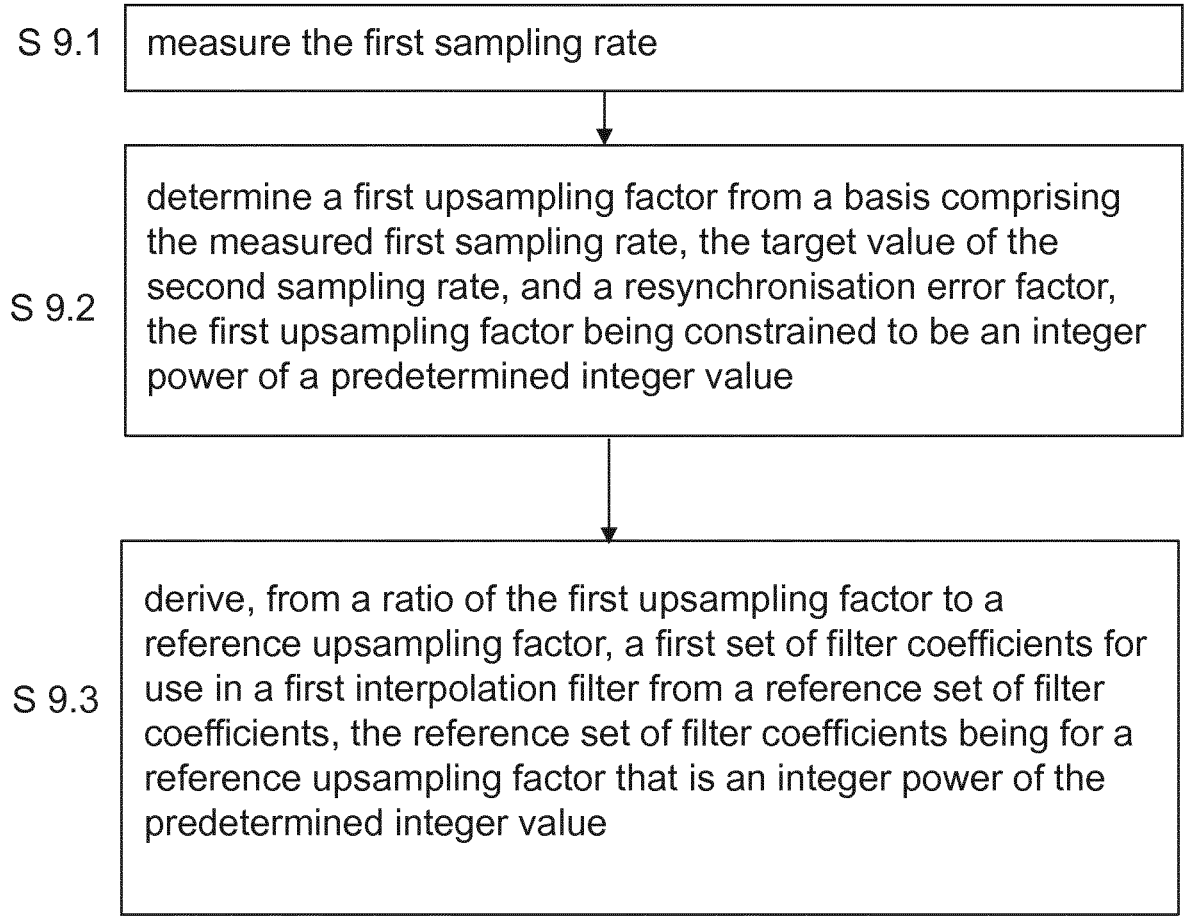
FIG. 9 is a flow diagram of a method according to an embodiment of the invention comprising determining an upsampling factor and selecting a set of filter coefficients.

FIG. 9 is a flow diagram showing a method according to an embodiment of the invention comprising determining an upsampling factor and selecting a set of filter coefficients by steps S9.1 to S9.3.

Figure 10:
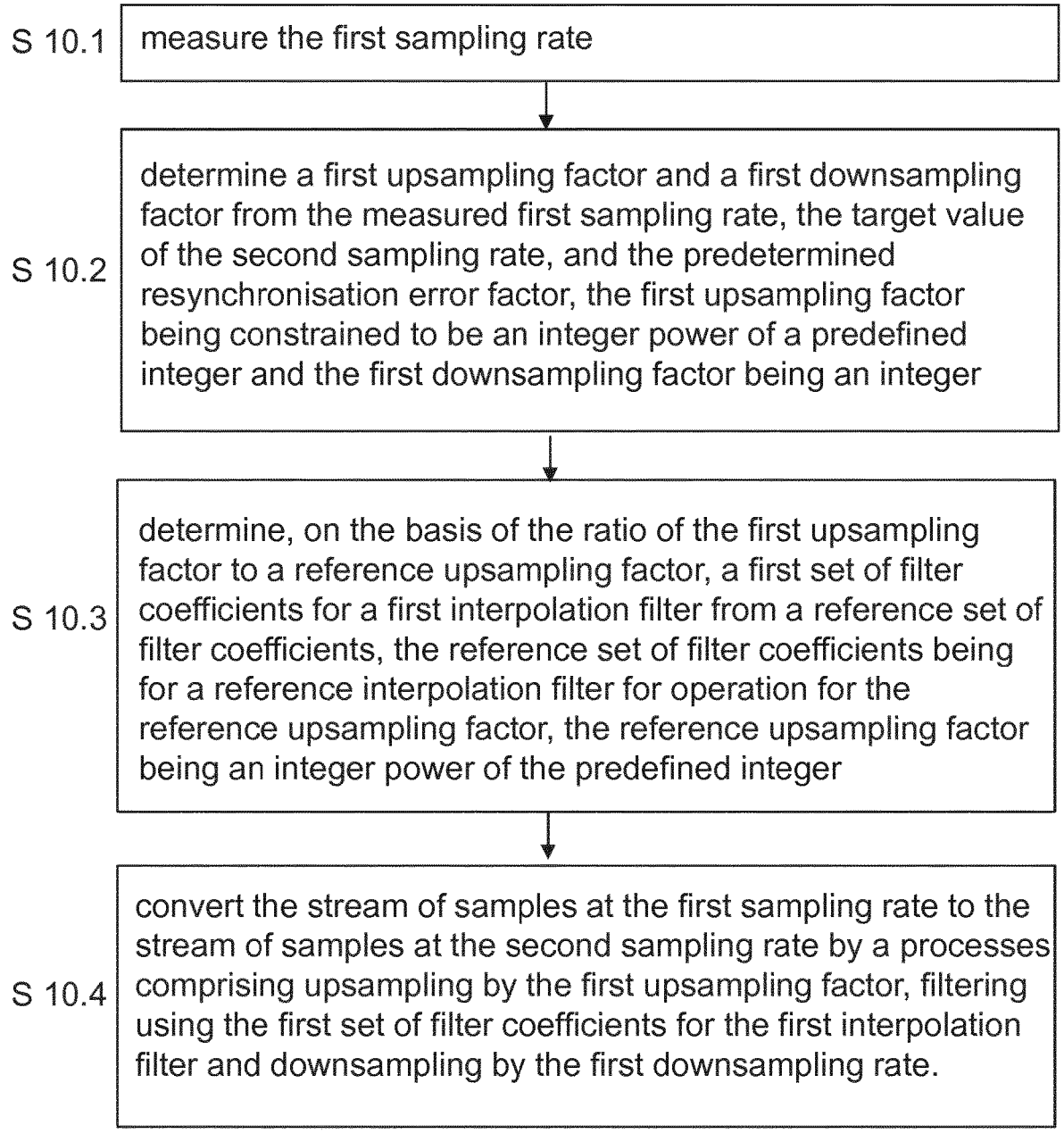
FIG. 10 is a flow diagram of a method of sampling rate conversion in an embodiment of the invention.

FIG. 10 is a flow diagram showing a method of sampling rate conversion in an embodiment of the invention by steps S10.1 to S10.4.

Figure 11:
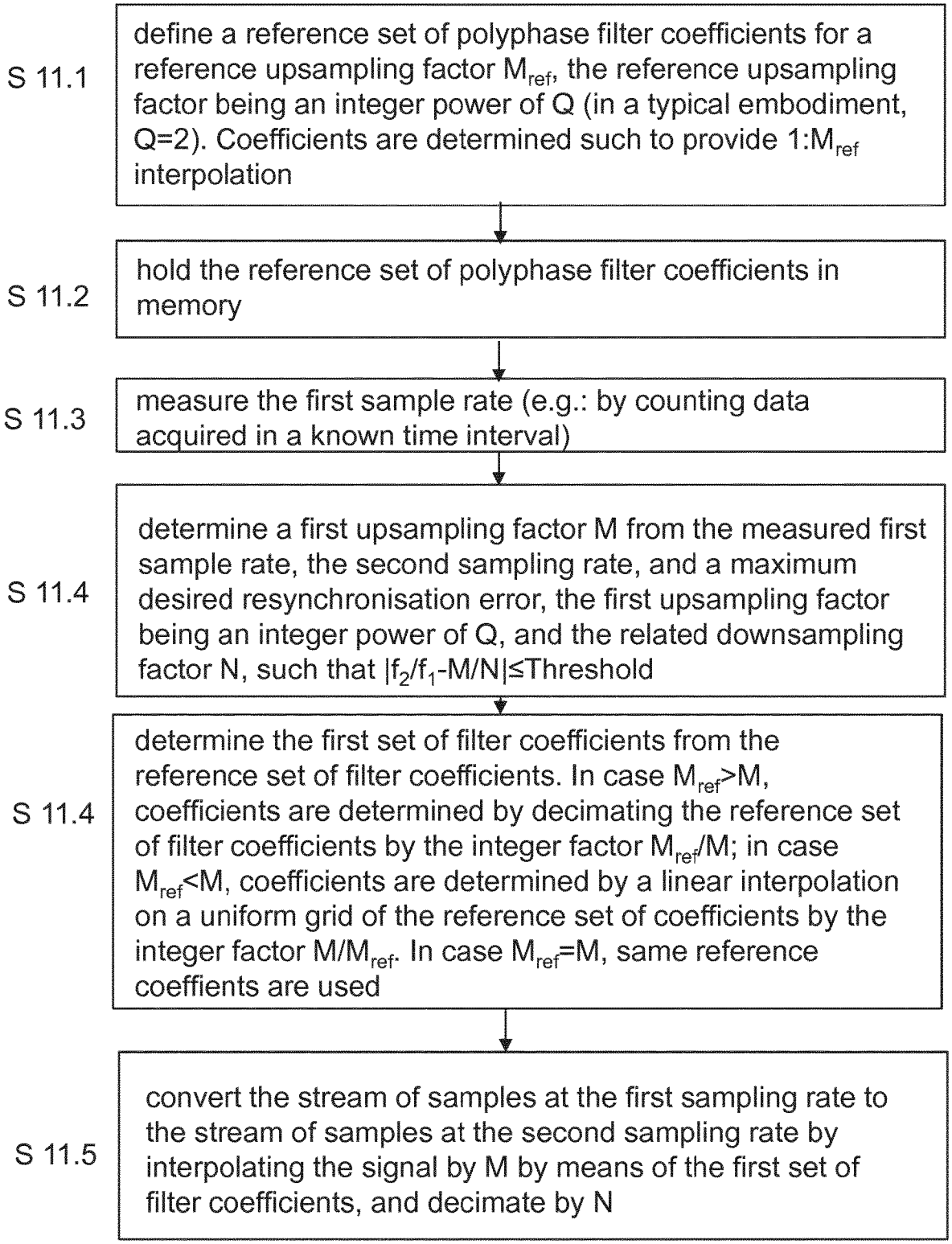
FIG. 11 is a further flow diagram of a method of sampling rate conversion in an embodiment of the invention.

FIG. 11 is a further flow diagram of a method of sampling rate conversion in an embodiment of the invention by steps S11.1 to S11.5.

Embodiments of the invention may provide synchronization performance matching a defined target precision, even when the input signals are characterized by a high spread of the sampling rate frequency, of the order of ±10% or more.

Embodiments of the invention may be beneficial in the acquisition systems characterized by high spread of the source's nominal sampling frequencies, in particular MEMS sensors, which are typically affected by high sampling rate variability, in the order of ±10%. Such high variability is related to the type of oscillators used by MEMS sensors integrated in silicon, typically a LC or RC type. These types of oscillator are typically characterized by low accuracy in comparison with the accuracy of a quartz oscillator accuracy and by a spread of the generated frequency that typically depends on the spread of the silicon process. Furthermore, the sampling frequency variation may be influenced by the operating conditions such as temperature, and also by aging and other factors. Such factors may not be easily predictable.

In an embodiment of the invention a resynchronized output signal may be provided at a certain frequency fo, matching a desired resynchronization precision, and starting from an input signal sampled at a sampling rate fi that may be affected by an high deviation with respect to the nominal value. This may be implemented by a low complexity algorithm, using limited hardware and/or software resources. The algorithm may be scalable to the available architecture and to the potential hardware and/or software resource of a target architecture, such as available memory and computing resource. The technique may also be easily implemented by firmware and/or software for real time processing, or it may be executed in post processing.

In embodiments of the invention, a polyphase filter is used to implement an FIR filter for interpolation. The polyphase filtering technique may operate as follows. From an input frequency fi and output frequency fo, two coprime integer numbers [M, N] are identified such that $f_i/f_o=N/M$, the polyphase filter comprises a bank of M filter phases. Each bank is applied at a time instant m, through a cyclic algorithm, so that the applicable bank to the m-th output time instant is a function of m, N and M. The filter's bandwidth is 1/max(M,N) (at the M-times oversampled rate).

In a general case, if fi is affected by high variability, fo being fixed, and representing the desired output frequency, the fi/fo ratio may not be a single value but a set of values belonging to a certain interval. As a consequence, it may be that the pair [M,N] is not uniquely defined, so that there may not a single filter and a single banks selection's logic defined. A set of filters may be needed, one for each [M,N] pair, each one having its his own bandwidth, and each one managed by dedicated logic. Accordingly, potentially the complexity of an adaptive polyphase filter can grow for high variability of fi. As the range of fi values increases, and the range of the necessary [M,N] set of values increases, and the required memory may also increase because of a need to store many polyphase filters, one for each [M,N] pair.

In embodiments of the invention, even if fi/fo is highly variable, a single reference polyphase filter may be stored, corresponding to $M_{ref}$, and only a reduced set of [M,N] may be considered, related to the fi variation in the input range, such that is it possible to maintain the algorithm complexity under control and within boundary conditions and still compliant with the required resynchronization accuracy.

Embodiments of the invention may use a reduced set of value M, where $M=2^n$, and $n=[1, 2, \ldots n_{max}]$, where $2^{nmmax}$ is compliant with the best desired resynchronization accuracy.

Embodiments of the invention may configure the polyphase filter corresponding to a certain [M,N] pair starting from the reference polyphase filter, and rebuild samples with real time data processing obtained by linear interpolation or by integer decimation of the reference filter coefficients, which may typically involve very simple processing.

The rate conversion process may require computation of the parameters [M, N], the upsampling and the downsampling factors. M and N are integer coprime numbers such that, ideally, $N/M=f_1/f_0$. In a real system those two frequencies are unlikely to be in a rational ratio, so M and N may be defined as follow. M and N are two integer coprime numbers, such as N/M ratio expresses fi frequencies and fo frequencies ratio with the desired approximation.

In this way the resynchronization error related to a defined choice of M and N becomes an important performance parameter to consider during the device design phase. The resynchronization error $e_s$ may be given as follows.

$$e_s=|(f_0-(M/N)f_i)/f_0|$$

In case of MEMS sensors characterized by a high variability of sampling frequency rate (e.g.: ±10%), [M,N] will be variable, depending on the type of resource used and environ-mental condition such as working temperature and aging.

Embodiments of the invention may comprise a source frequency estimation module and a related [M, N] calculation module, a sample rate converter coefficient calculation module, and a sample rate converter core module. The source frequency estimation module and the related [M, N] calculation module may compute M in the form $M=2^n$, being $M \leq M_{max}$, where $M_{max}$ is chosen in such a way that, by varying [M,N], the resynchronization is achieved with an error $e_s$ lower than a fixed limit. The sample rate converter coefficient calculation module, may calculate coefficients once [M, N] have been computed. This calculation may be based on the prototype filter, that is to say reference filter, stored in memory. It may provide current coefficients simply by linear interpolation or integer decimation of the polyphase filter coefficients. The Sample Rate Converter core module may be programmed using the coefficients and parameters calculated in an adaptive way, to execute the filtering.

The above embodiments are to be understood as illustrative examples of the invention. It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention, which is defined in the accompanying claims.

The invention claimed is:

1. A method of converting a stream of samples at a first sampling rate to a stream of samples at a second sampling rate, the first sampling rate being subject to deviation from a nominal value and the second sampling rate being within a predetermined resynchronisation error factor from a target value, the method comprising:
   measuring the first sampling rate;
   determining a first upsampling factor from a basis comprising: the measured first sampling rate, the target value of the second sampling rate, and the predetermined resynchronisation error factor, the first upsampling factor being constrained to be an integer power of a predetermined integer value; and
   deriving, from a reference set of filter coefficients and from a ratio of the first upsampling factor to a reference upsampling factor, a first set of filter coefficients for use in a first interpolation filter, the reference set of filter coefficients being for the reference upsampling factor that is the integer power of the predetermined integer value.

2. A method according to claim 1, wherein deriving the first set of filter coefficients from the reference set of filter coefficients comprises:
   in dependence on the first upsampling factor being greater than the reference upsampling factor, linear interpolation between the reference set of filter coefficients;
   in dependence on the first upsampling factor being equal to the reference upsampling factor, setting them to be the same as the reference set of filter coefficients; and
   in dependence on the first upsampling factor being less than the reference upsampling factor, uniform decimation from the reference set of filter coefficients, a decimation factor of the uniform decimation being equal to the integer ratio of the reference upsampling factor to the first upsampling factor.

3. A method according to claim 1, wherein the predetermined integer value is 2.

4. A method according to claim 1, wherein the first interpolation filter and the reference interpolation filter are polyphase filters.

5. A method according to claim 1, comprising:
   determining a first downsampling factor from a basis comprising: the measured first sampling rate, the target value of the second sampling rate, and the predetermined resynchronisation error factor, the first downsampling factor being an integer; and
   converting the stream of samples at the first sampling rate to the stream of samples at the second sampling rate by a processes comprising upsampling by the first upsampling factor, filtering using the first set of filter coefficients for the first interpolation filter and downsampling by the first downsampling factor.

6. A method according to claim 5, wherein determining the first upsampling factor and the first downsampling factor comprises:
   determining a ratio of the target value of the second sampling rate to the measured first sampling rate; and
   selecting the value of the first upsampling factor and the first downsampling factor such that the error factor between the ratio of the target value of the second sampling rate to the first sampling rate and the ratio of the first upsampling factor to the first downsampling factor is less than the predetermined resynchronisation error factor.

7. A method according to claim 6, comprising:
   selecting a trial value of the first upsampling factor;
   determining a trial value of the first downsampling factor on the basis of the determined ratio of the target value of the second sampling rate to the measured first sampling rate and on the selected trial value of the first upsampling factor;

calculating a resynchronisation error factor on the basis of the trial values of the first upsampling factor and the first downsampling factor;

in dependence on the resynchronisation error factor being greater than a threshold value, iteratively incrementing the trial value of the first upsampling factor and the trial value of the first downsampling factor and calculating a resynchronisation error factor; and selecting a respective value of the incremented first upsampling factor and the first downsampling factor which gives a resynchronisation error factor less than or equal to the threshold value.

8. A method according to claim 1, wherein the deviation from the nominal value of the first sampling rate is greater than 1%.

9. A method according to claim 8, wherein the deviation from the nominal value of the first sampling rate is greater than 10%.

10. An apparatus for converting a stream of samples at a first sampling rate to a stream of samples at a second sampling rate, the first sampling rate being subject to deviation from a nominal value and the second sampling rate being within a predetermined resynchronisation error factor from a target value, the apparatus comprising a processor and a memory, the processor further configured to:
measure the first sampling rate;
determine a first upsampling factor from a basis comprising: the measured first sampling rate, the target value of the second sampling rate, and the predetermined resynchronisation error factor, the first upsampling factor being constrained to be an integer power of a predetermined integer value; and
derive, from a reference set of filter coefficients and from a ratio of the first upsampling factor to a reference upsampling factor, a first set of filter coefficients for use in a first interpolation filter, the reference set of filter coefficients being for the reference upsampling factor that is the integer power of the predetermined integer value.

11. A sensing system for a vehicle, comprising:
a micro-electromechanical system (MEMS) sensor configured to generate a stream of samples at a first sampling rate;
a data processing system configured to accept a stream of samples at a second sampling rate; and
a processor configured to:
measure the first sampling rate, the first sampling rate being subject to deviation from a nominal value and the second sampling rate being within a predetermined resynchronisation error factor from a target value;
determine a first upsampling factor from a basis comprising: the measured first sampling rate, the target value of the second sampling rate, and the predetermined resynchronisation error factor, the first upsampling factor being constrained to be an integer power of a predetermined integer value; and
derive, from a reference set of filter coefficients and from a ratio of the first upsampling factor to a reference upsampling factor, a first set of filter coefficients for use in a first interpolation filter, the reference set of filter coefficients being for the reference upsampling factor that is the integer power of the predetermined integer value.

* * * * *